United States Patent
Tonosaki et al.

(10) Patent No.: US 7,366,820 B2
(45) Date of Patent: Apr. 29, 2008

(54) SECOND-CACHE DRIVING/CONTROLLING CIRCUIT, SECOND CACHE, RAM, AND SECOND-CACHE DRIVING/CONTROLLING METHOD

(75) Inventors: Mie Tonosaki, Kawasaki (JP); Tomoyuki Okawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 466 days.

(21) Appl. No.: 10/999,065

(22) Filed: Nov. 30, 2004

(65) Prior Publication Data

US 2006/0026352 A1 Feb. 2, 2006

(30) Foreign Application Priority Data

Jul. 29, 2004 (JP) ............................. 2004-221155

(51) Int. Cl.
*G06F 12/06* (2006.01)
*G11C 7/10* (2006.01)
*G11C 7/22* (2006.01)
*G11C 11/4195* (2006.01)
*G11C 11/4197* (2006.01)

(52) U.S. Cl. ............................ 711/3; 711/5; 711/119; 711/152; 711/163; 365/189.05; 365/227

(58) Field of Classification Search ............... 711/3, 711/119, 140, 163; 365/189.05, 227
See application file for complete search history.

(56) References Cited

U.S. PATENT DOCUMENTS

| | | | | |
|---|---|---|---|---|
| 4,686,621 A | * | 8/1987 | Keeley et al. ................. 714/40 |
| 4,884,270 A | * | 11/1989 | Chiu et al. .................... 714/719 |
| 5,047,920 A | * | 9/1991 | Funabashi .................... 711/117 |
| 6,351,433 B1 | | 2/2002 | Kosugi | |
| 2002/0129201 A1 | | 9/2002 | Maiyuran et al. | |
| 2002/0133664 A1 | * | 9/2002 | Endo ............................ 711/3 |
| 2003/0037217 A1 | | 2/2003 | Middleton et al. | |
| 2003/0156472 A1 | | 8/2003 | Satou et al. | |

FOREIGN PATENT DOCUMENTS

| | | |
|---|---|---|
| JP | 2003-67245 | 3/2003 |
| JP | 2003-242029 | 8/2003 |
| JP | 2003242029 | 8/2003 |

OTHER PUBLICATIONS

European Search Report dated Jul. 3, 2006.

* cited by examiner

*Primary Examiner*—Jack Lane
(74) *Attorney, Agent, or Firm*—Staas & Halsey LLP

(57) ABSTRACT

A circuit for driving and controlling a second cache that is incorporated in a processor and comprises a plurality of RAM. The circuit comprises a second-cache control unit 1A and a chip-enable control unit 61. The second-cache control unit 1A receives an access request for an access to the second cache and designates some of the RAMs, which need not operate, in accordance with the type or address of the access request, or both. The chip-enable control unit 61 outputs an intra-macro stop-instructing signal to the RAMs that have been designated by the second-cache control unit 1A.

10 Claims, 8 Drawing Sheets

SECOND-CACHE DRIVING/CONTROLLING CIRCUIT, SECOND CACHE, RAM, AND SECOND-CACHE DRIVING/CONTROLLING METHOD

BACKGROUND OF THE INVENTION

1. Field of the Invention

The present invention relates to a circuit for driving and controlling a second cache incorporated in a processor and comprising a plurality of RAM blocks. The invention relates to a second cache and a RAM, too. Further, the invention relates to a method of driving and controlling a second cache. More particularly, this invention relates to measures taken to save electric power in processing data at high speeds.

2. Description of the Related Art

In the past, processors had only an LBS (i.e., first cache). At present, processors having not only the first cache, but also the second cache, are used in increasing numbers. This is because the access to data should now be made at a higher speed than before. The storage capacity and access performance of the second cache have come to determine the operating efficiency of the processor. The storage capacity of the second cache has kept increasing. Importance has been placed only on methods of accessing the second cache fast and efficiently. The inevitably trend is that the power the processor consumes increases in proportion to the storage capacity of the RAM provided in the processor.

Recently, various attempts have been made to reduce the power consumption in processors. One of these attempts is to inhibit the supply of the clock signal to any RAM that need not be accessed, in accordance with whether a valid request has been made for the access to the second cache. The power consumption in the second cache can thereby be reduced.

FIG. 6 shows the configuration of a second cache. The second cache comprises 8 word blocks Word0 to Word7, each consisting of 16 RAMs. Each RAM consists of one of WAY0 to WAY3 and one of BANK0 to BANK3. The RAMs of each word block are controlled by a second-cache control unit 1.

In the prior art, the supply of the clock signal to all RAMs is inhibited as shown in FIG. 7, as long as the control unit 1 makes no valid requests for access to the second cache is made. When a valid request for the access to the second cache, any bank that needs the clock signal is determined from the address of the access request. Thus, the supply of the clock signal to any RAM that is not used is inhibited.

There are three types of access requests. They are ReaD request (RD MODE), WriTe request (WT_MODE), and MoDify request (MD_MODE). These requests are sent from the processor to the second cache through the second-cache control unit. In accordance with the mode pertaining to each access request, only a specific number of RAMs are the driven, as set forth below.

In RD_MODE, 32 RAMs (=4 ways×1 bank×8 words) are accessed.

In WT_MODE, 8 RAMs (=1 way×1 bank×8 words) are accessed.

In MD_MODE, 8 RAMs (=1 way×1 bank×8 words) are accessed.

FIG. 8 shows the clock-supply control circuit that is provided in the second cache. The bank value is defined by one of the addresses that access the second cache, i.e., ADRS<19:18>. The bank value for each RAM is determined from the bit content of the address ADRS. On the basis of the bank value and the type of access (i.e., RD_MODE in the case illustrated in FIG. 8), the RAM (i.e., way and bank) to which the clock signal should not be supplied (or should be supplied) is determined. A non-enable signal (or an enable signal) is supplied to the enable terminal of this RAM3. In the case depicted in FIG. 8, the RAMs for banks BANK1, 2 and 3 at ways WAY0 to WAY3 are stopped.

Known as a device related to the prior art described above is a semiconductor integrated circuit that enables the second cache, if necessary, to operate at an increased speed or at smaller power consumption. (See, for example, Japanese Patent Laid-Open No. 2003-242029.)

It is increasingly demanded that processors should operate faster. To meet the demand, the RAMs of the second cache are accessed in synchronism with the pipeline of any processor. This renders it difficult to inhibit the supply of the clock signal to the RAMs at an appropriate timing.

The conventional RAM is accessed once for every period $2\tau$ of the request pipeline of the processor ($\tau$ is a unit time). Thus, the clock control signal needs to arrive within $2\tau$. For the pipelined RAM that can be accessed every $\tau$, in synchronism with the request pipeline of the processor, the clock control signal must arrive at the time an access request comes.

To such a high-speed RAM, a request for input signals to the RAM can hardly be made at an appropriate time. This is why it is difficult to inhibit the supply of the clock signal to the RAMs at an appropriate timing.

The technique disclosed in Japanese Patent Laid-Open No. 2003-242029 is to suppress the data-processing speed for the purpose of reducing the power consumption. In this sense, the technique cannot achieve the object of the present invention, i.e., to reduce the power consumption, while maintaining the high data-processing speed.

SUMMARY OF THE INVENTION

The present invention has been made in view of the foregoing problems. Therefore, an object of the invention is to provide a circuit for driving and controlling a second cache incorporated in a processor, which reduces the supply of unnecessary power, suppresses heat generation, helps to stabilize the processor, makes the processor more reliable and suppresses the power consumption, without decreasing the data-processing speed of the processor. The circuit is therefore desirable in view of environmental protection. Another object of the invention is to provide a second cache, a RAM, and a method of driving and controlling a second cache.

To attain the above-mentioned object, a circuit according to this invention is designed to drive and control a second cache that is incorporated in a processor and comprises a plurality of RAMs. The circuit comprises: a decision unit that receives an access request for an access to the second cache and designates some of the RAMs, which need not operate, in accordance with the type or address of the access request, or both; and a stop-instruction output unit that outputs an intra-macro stop-instructing signal to the RAMs that have been designated by the decision unit.

Upon receiving the access request, the decision unit may designate RAMs that need not operate, in accordance with a combination of WAY and BANK. The access request may include a read request, a write request and a modify request.

A second cache according to the present invention is designed for use in a processor and comprising a plurality of RAMs. The second cache comprises: a decision unit that receives an access request for an access to the second cache and designates some of the RAMs, which need not operate, in accordance with the type or address of the access request, or both; a stop-instruction output unit that outputs an intra-macro stop-instructing signal to the RAMs that have been designated by the decision unit; and an operation-stopping unit that is provided in each of the RAMs and stops the operation of the RAM in response to the intra-macro stop-instructing signal from the stop-instruction output unit.

In the second cache, each of the RAMs comprises a memory-cell array, a first group of latches that input various external data items to the RAM, and a second group of latches that access the memory-cell array at prescribed timing in accordance with the data items input from the latches of the first group; and the operation-stopping unit electrically disconnects the first group of latches and the second group of latches, or electrically disconnects the memory-cell array and the first and second groups of latches.

The second cache may further comprise a clock-input control unit that controls the inputting of a clock signal to some of the RAMs, which need not be used in some cases, in accordance with information representing how many RAMs should not be used.

In the second cache, each of the RAMs may be a pipelined RAM.

A RAM according to the invention comprises: a memory-cell array which stores data; a first group of latches that receive various external data items; a second group of latches that access the memory-cell array at prescribed timing in accordance with the data obtained at the latches of the first group; and an operation-stopping unit that receives an intra-macro stop-instructing signal from an external device and stops at least the memory cell array.

In the RAM, the operation-stopping unit electrically disconnects the first group of latches and the second group of latches, or electrically disconnects the memory-cell array and the first and second groups of latches, in accordance with the intra-macro stop-instructing signal supplied from the external device. The RAM may further comprise a chip-enable terminal that receives instruction signals supplied from an external devices. The RAM may be a pipelined RAM.

A method according to the present invention is designed to drive and control a second cache incorporated in a processor and comprising a plurality of RAMs. The method comprises: a step of receiving an access request for an access to the second cache and designating some of the RAMs, which need not operate, in accordance with the type or address of the access request, or both; and a step of outputting an intra-macro stop-instructing signal to the RAMs that have been designated in the step of receiving the access request and designating some of the RAMs.

As described above in detail, the supply of the clock signal to the second cache occupying a large area on a processor chip and the stopping of the intra-macro in the RAM are minutely controlled. Hence, the invention can provide a second-cache driving/controlling circuit, a second cache, a RAM and a second-cache driving/controlling method, in which power can be saved without decreasing the operating speed and the amount of heat generated is reduced. Therefore, the circuit, second cache, RAM and method help the processor to operate in a stable state, make the processor reliable, and are desirable in view of environmental protection.

DETAILED DESCRIPTION OF THE PREFERRED EMBODIMENTS

Embodiments of the present invention will be described, with reference to the accompanying drawings.

Figure 1:
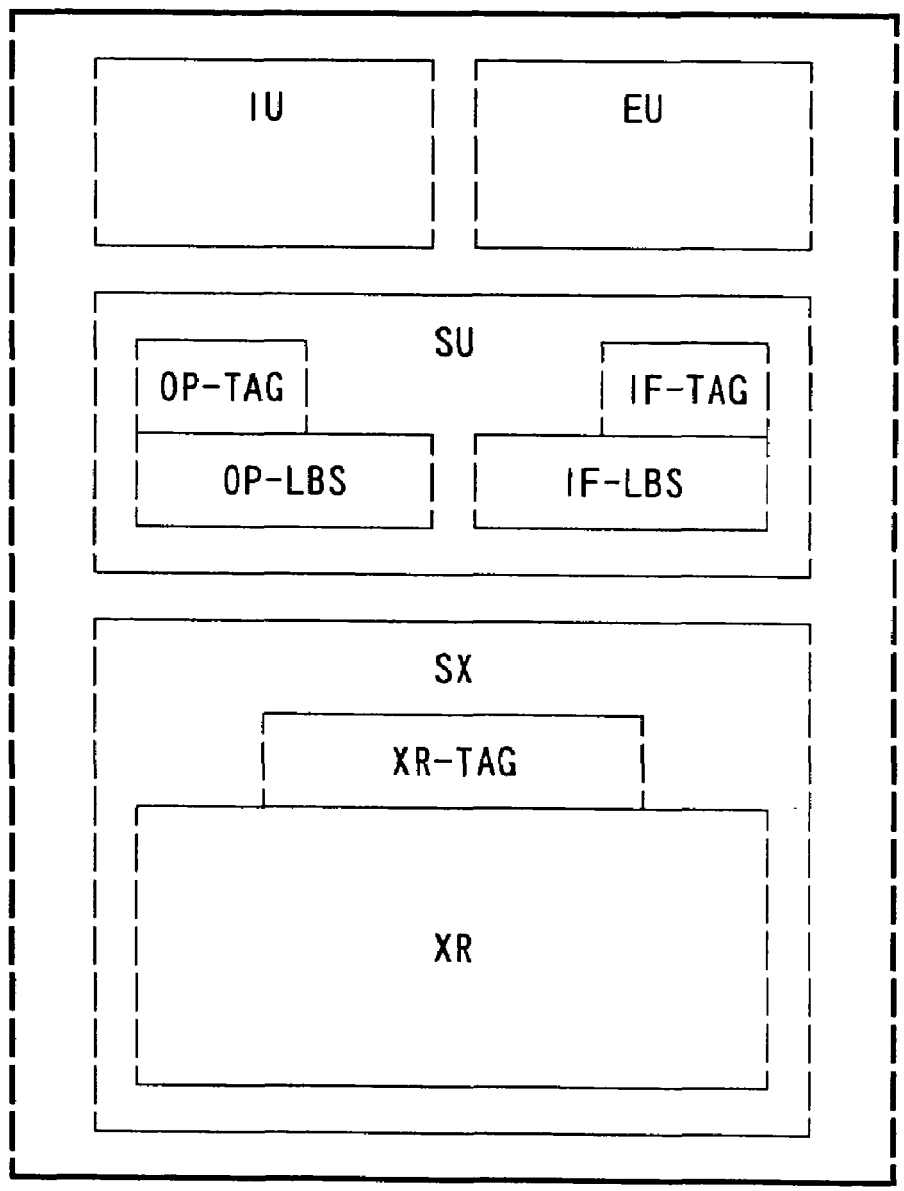
FIG. 1 is a diagram showing a processor for use in embodiments of this invention.

FIG. 1 is a schematic diagram showing a processor chip for use in the embodiments of this invention. The processor comprises an operation control unit IU, an operation unit EU, a memory control unit SU, a second-cache control unit SX, an LBS-TAG unit (first-cache tag unit, OP-TAG/IF-TAG), an LBS-DATA unit (first-cache data unit, OP-LBS/IF-LBS), a second-cache TAG unit (XR-TAG), and a second-cache DATA unit XR.

Figure 6:
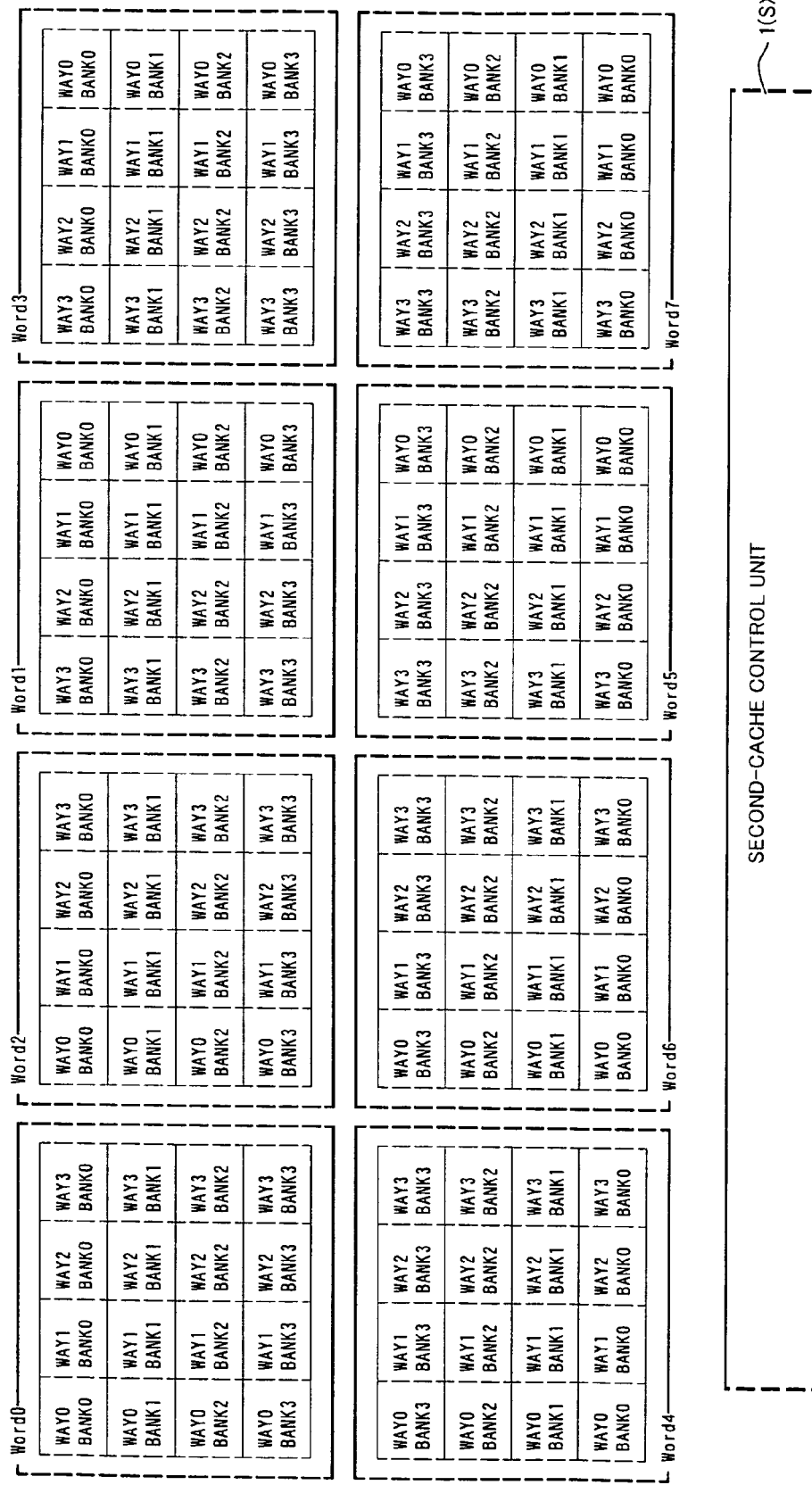
FIG. 6 is a block diagram illustrating the configuration of a second cache.
Figure 7:
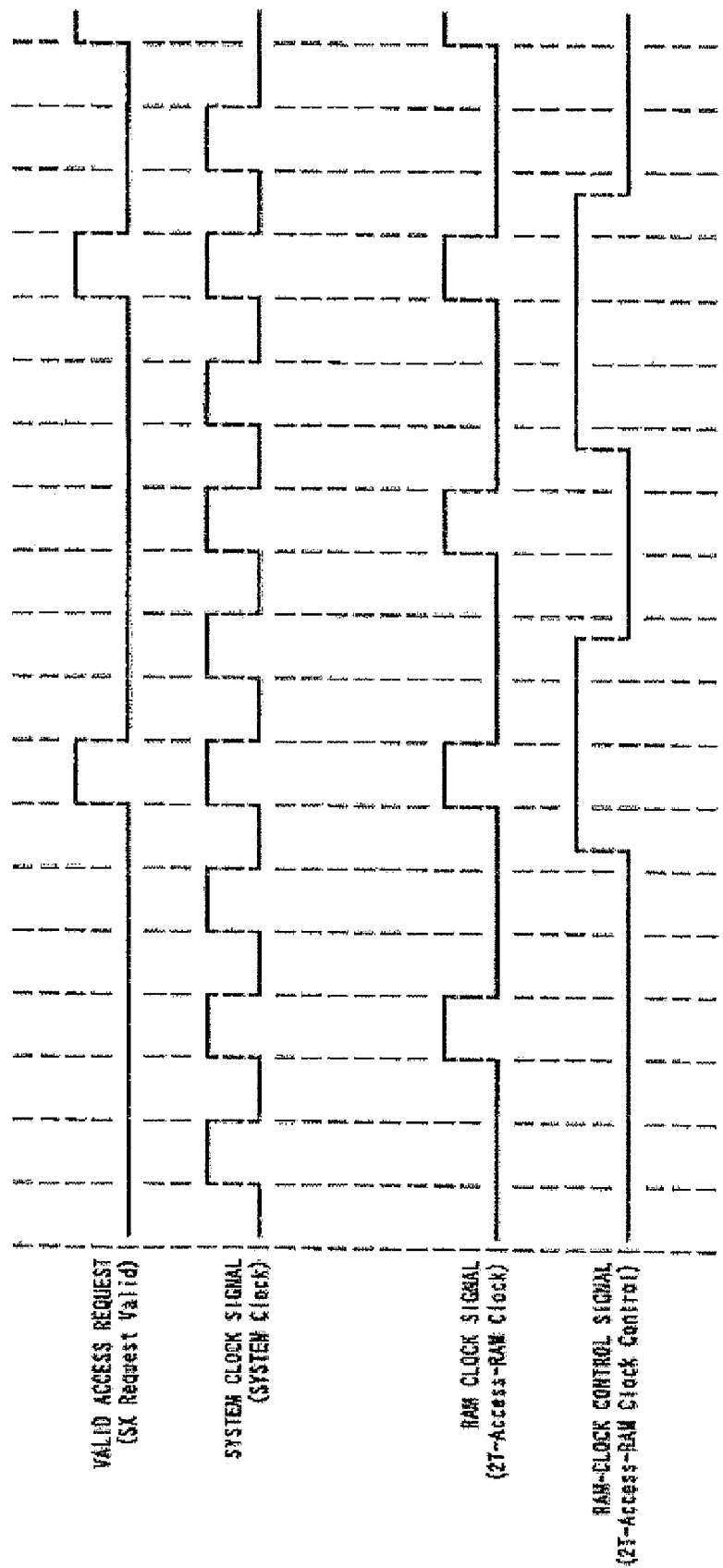
FIG. 7 is a timing chart explaining how the supply of the clock signal to all RAMs is inhibited in the prior art.
Figure 8:
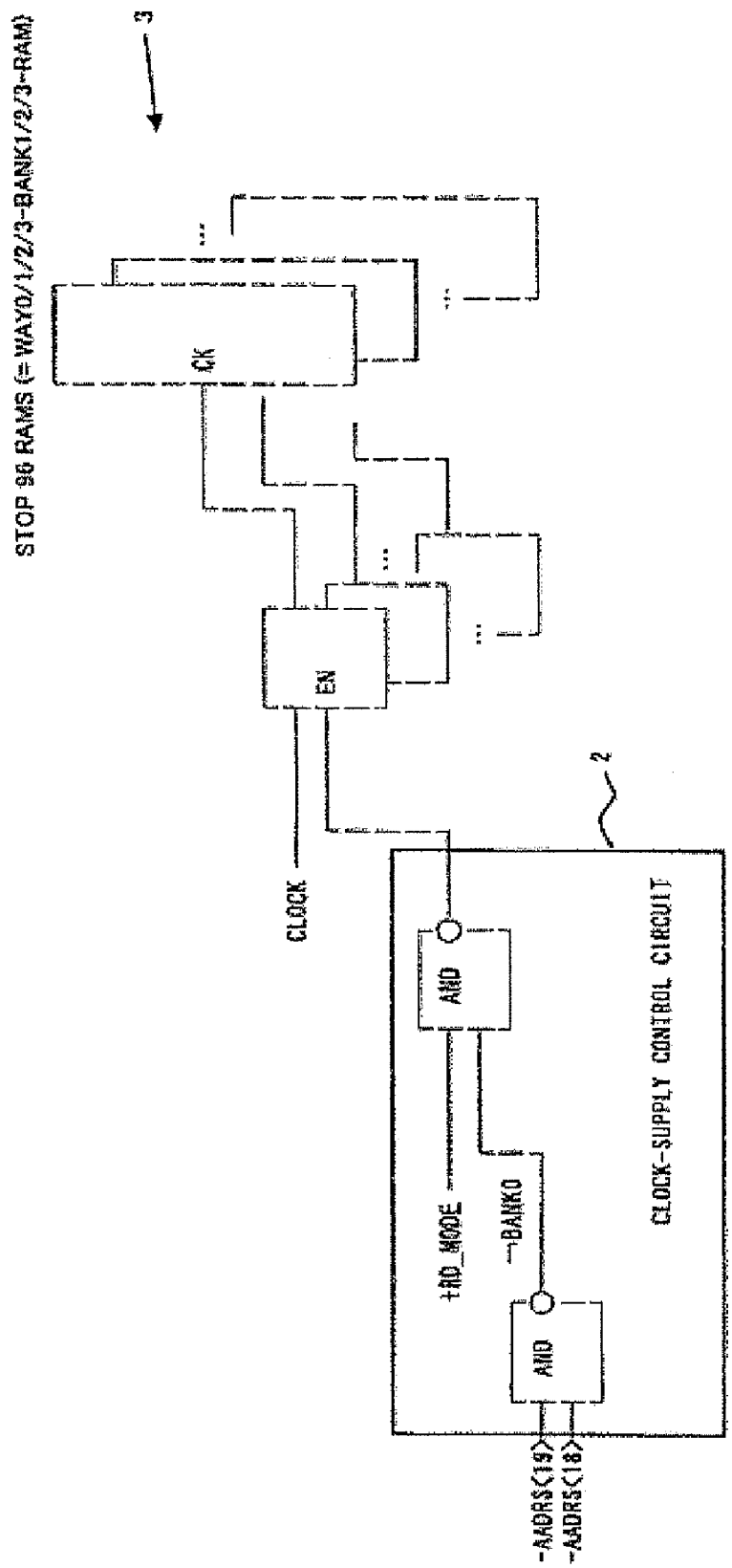
FIG. 8 is a block diagram showing a clock-supply control circuit used in the prior art.

The second cache has the same configuration as illustrated in FIG. 6. That is, it comprises 8 word blocks Word0 to Word7, each consisting of 16 RAMs (pipelined RAMs). Each RAM consists of one of WAY0 to WAY3 and one of BANK0 to BANK3. The second cache has a storage capacity of 4 MB. It is composed of 4 banks, each consisting of four ways. Thus, it has 128 4K-RAMs.

Each bank has a value that is defined by one of the addresses that access the second cache, i.e., ADRS<19:18>. In the present embodiment, the second cache occupies about half the area of the processor chip. The processor may make an access request, which is sent via the control unit. There are three types of access requests. They are ReaD request (RD_MODE), WriTe request (WT_MODE), and MoDify request (MD_MODE).

Figure 2:
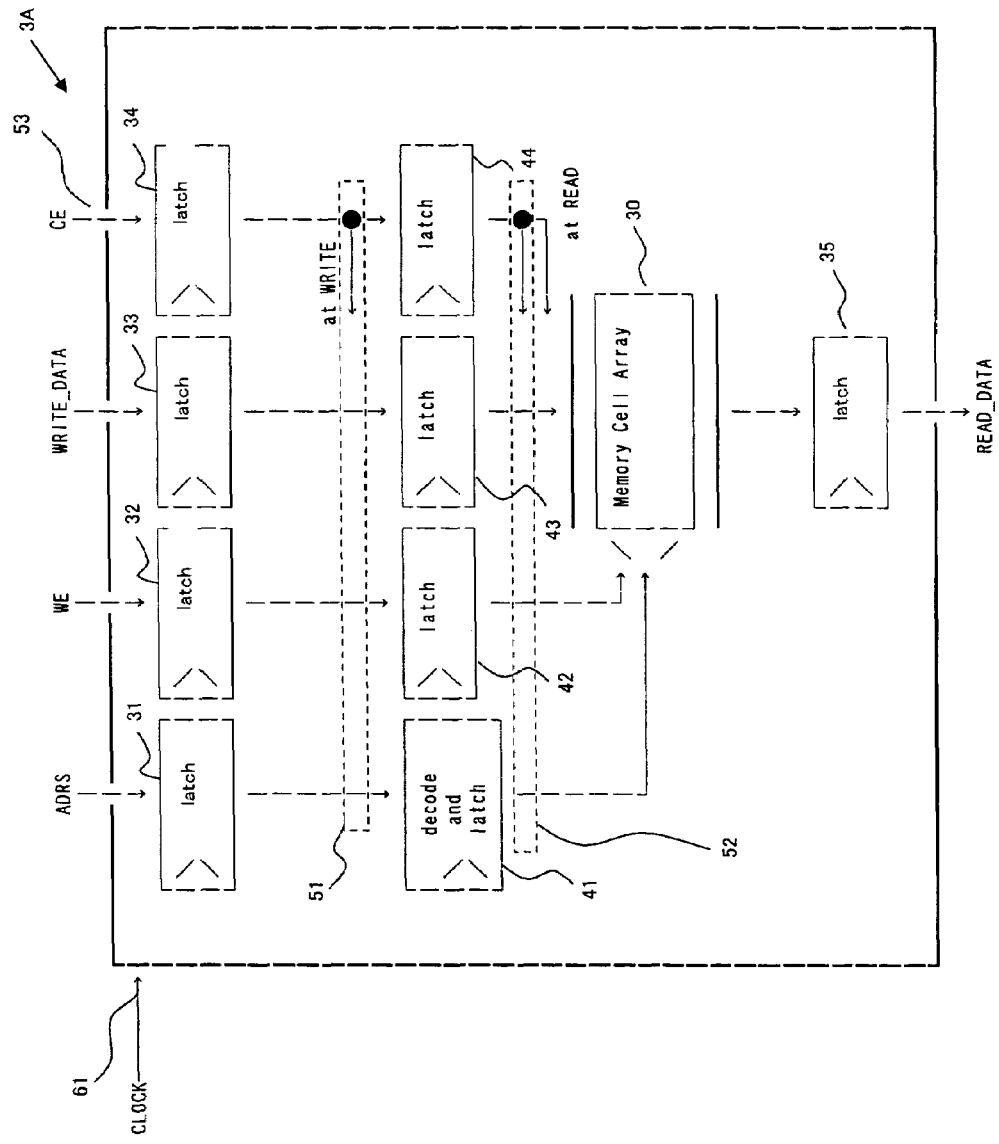
FIG. 2 is a block diagram depicting the configuration of a RAM in the embodiments according to the invention.

FIG. 2 is a block diagram depicting one of the RAMs that constitute the second cache. This RAM 3A comprises a memory-cell array 30, latches 31 to 34 (first latch group), latches 41 to 44 (second latch group), switching elements 51 and 52. The memory-cell array 30 stores data. The latches 31 to 34 are provided to input external data. The latches 41 to 44 are set to supply the data from the latches 31 to 34 to the memory cell array 30. (Namely, the latches 41 to 44 access the memory-cell array 30 at predetermined timing, in accordance with the data obtained from the latches of the first group.) The switching elements 51 and 52 constitute a signal-interrupting unit that is driven by an external instruction signal. The elements 51 and 51 can electrically isolate the latches 41 to 44 of the second group at least either from the latches 31 to 34 of the first group, or from the memory cell array 30. The elements 51 and 52 therefore stop the RAM macro. Note that the latches 41 to 44 of the second group operate in synchronism with the pipeline. They can therefore access the memory-cell array 30 (to read and write data from and into the array 30) if the operating timing of the pipeline is adjusted.

The RAM 3A further comprises a chip-enable terminal 53, a clock input terminal 61, and a latch 35. The chip-enable terminal 53 receives the above-mentioned instruction signal from an external device. The latches 31 to 33 scan an address (ADRS), a write-enable signal (WE), and write data (WD), respectively. The clock signal (CLOCK) is supplied to the clock input terminal 61. The data read from the memory-cell array 30 is output from the RAM 3A, through the latch 35.

Embodiment 1

Figure 3:
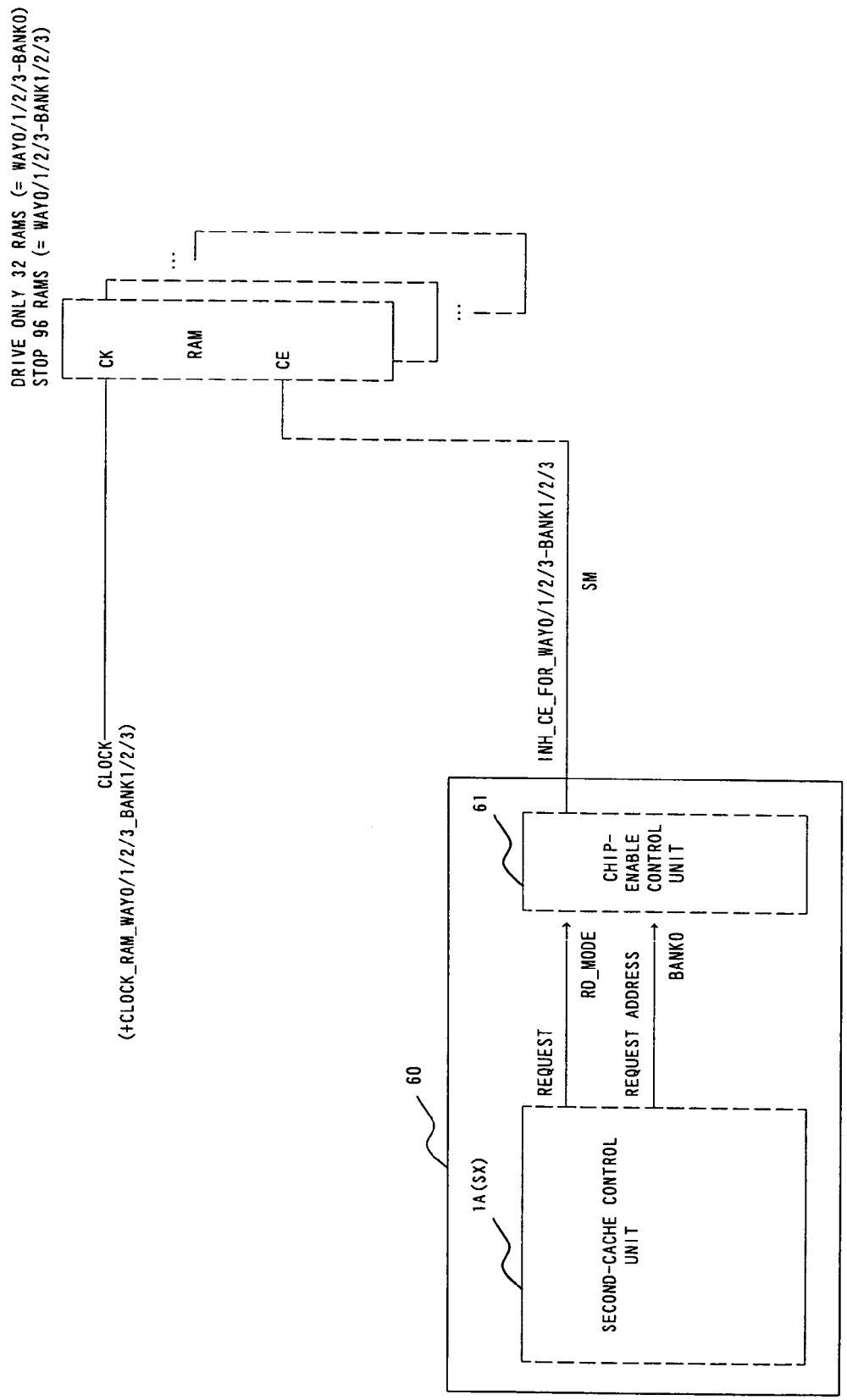
FIG. 3 is a block diagram of Embodiment 1 of the invention.

FIG. 3 is a block diagram of Embodiment 1 of the present invention.

Embodiment 1 operates when the access request that the processor has made is an RD_MODE signal. FIG. 3 shows a second-cache control unit 60. The second-cache control circuit 60 comprises a second-cache control unit (unit SX) 1A and a chip-enable control unit 61. The chip-enable control unit 61 controls the supply of a chip-enable signal in accordance with a control signal supplied from the second-cache control unit 1A.

The second-cache control unit 1A receives an access request, i.e., a signal requesting for an access to the second cache. The control unit 1A determines which ones of the RAMs constituting the word blocks will be unnecessary (need not be accessed), from the type of the access request and the address information thereof. Thus, the control unit 1A is a decision unit that outputs a bank value and a request to the chip-enable control unit 61. Note that the bank value pertains to the block that is constituted by unnecessary RAMs.

The chip-enable control unit 61 outputs a chip-enable signal (access-disable signal). This signal is a stop-instructing signal for stopping the RAMs designated by the request and the bank value, both output from the second-cache control unit 1A. That is, the unit 61 is one that outputs a stop-instructing signal.

The operation of Embodiment 1 will be described, with reference to FIG. 3. In this embodiment, the request is a read request made to the second cache. The second-cache control unit 1A outputs an RD_MODE signal, i.e., request signal, to the chip-enable control unit 61. The unit 1A outputs a bank value (e.g., "0"), as request address, to the chip-enable control unit 61, too.

Upon receipt of the RD_MODE signal and the bank value, the chip-enable control unit 61 determines the way allocated to the RD_MODE. (In this instance, the unit 61 determines all ways because the second-cache control unit 1A cannot infer ways for all ways WAY0 to WAY3:RD_MODE.) To make only the RAMs of the bank BANK0 in WAY0 to WAY3 and to stop any other RAMs, the chip-enable control unit 61 outputs a stop-instructing signal SM to BANK1, BANK2 and BANK3 in WAY0, WAY1, WAY2 and WAY3.

In any RAM that has received the stop-instructing signal SM, the switching element 52 provided between the memory-cell array 30 and the group of latches 41 to 44 is driven, thereby stopping the RAM.

In Embodiment 1, 32 RAMs (=4 ways×1 bank×8 words) operate. Since these RAMs are pipelined ones that operate fast, the second cache can operate at high speed and can yet save power.

Embodiment 2

Embodiment 2 operates when the access request that the processor has made is a WT_MODE signal or MD_MODE signal.

Figure 4:
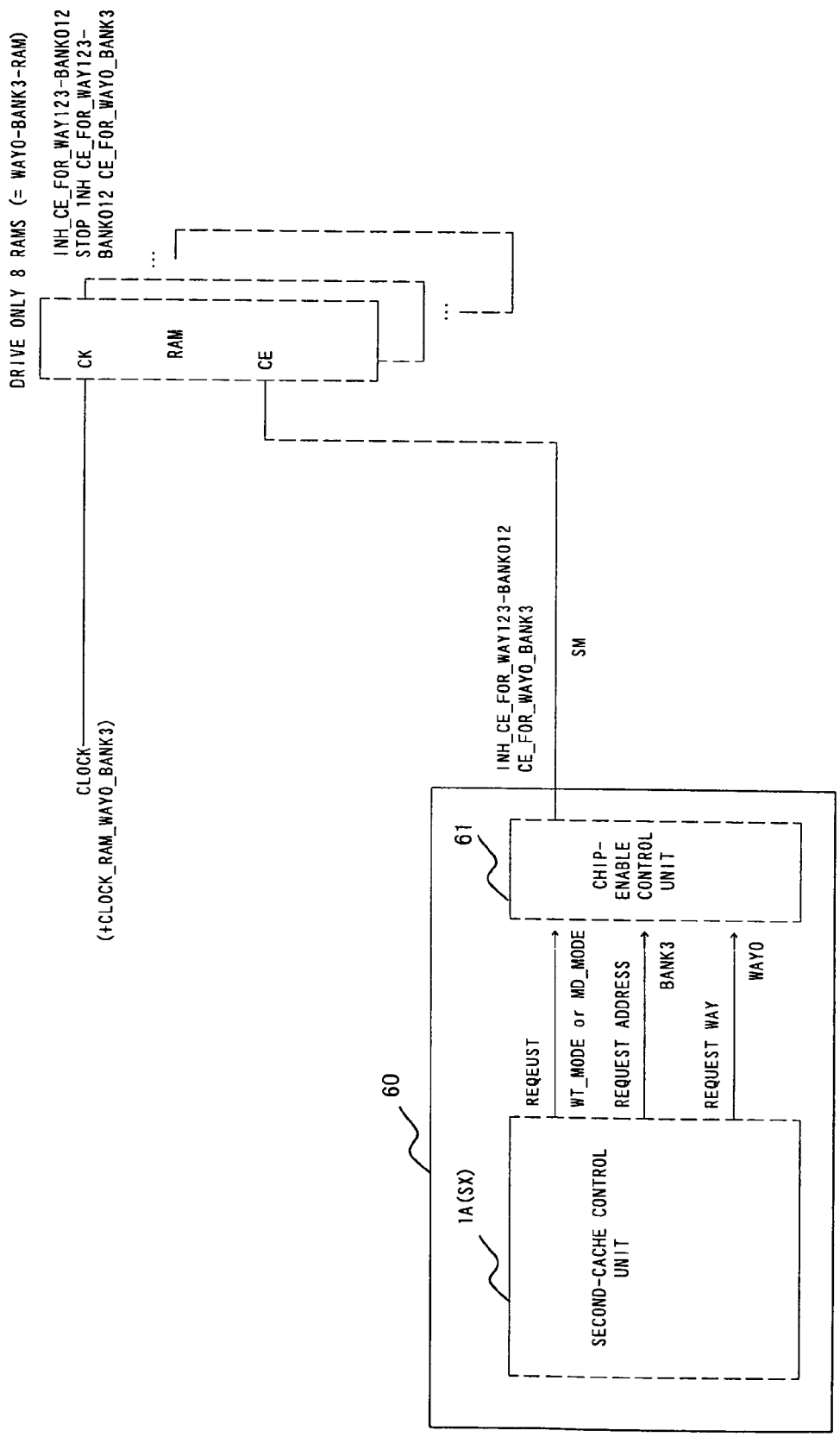
FIG. 4 is a block diagram of Embodiment 2 of the invention.

FIG. 4 is a block diagram of Embodiment 2. As seen from FIG. 4, Embodiment 2 is identical in basic configuration to Embodiment 1 illustrated in FIG. 3. Therefore, the configuration of Embodiment 2 will not be described.

How Embodiment 2 operates will be described. In this embodiment, the access request is either a write request (WT_MODE) or a modify request (MD MODE). The second-cache control unit 1A outputs a request signal, i.e., WT MODE signal or MD_MODE signal, to the chip-enable control unit 61. The second-cache TAG unit (XR-TAG) determines which bank and which way are described in the access request. A signal representing the bank and way described in the access request (for example, BANK3 and WAY0) is output to the chip-enable control unit 61.

Upon receipt of this signal, the chip-enable control unit 61 drives only the RAM of BANK3 in WAY0. The unit 61 then outputs a stop-instructing signal SM to stop other RAMs.

When the stop-instructing signal SM is input to the RAMs, the switching element 51 provided between the group of latches 31 to 34 and the group of latches 41 to 44 operates. The RAMs are thereby stopped.

In Embodiment 2, 8 RAMs (=1 ways×1 bank×8 words) operate. Since these RAMs are pipelined ones that operate fast, the second cache can operate at high speed and can yet save power.

Embodiment 3

Embodiment 3 comprises a clock-input control unit (clock-input limitation control unit). This control unit controls the inputting of the clock signal to some of the RAMs (i.e., a part of the set), which are not used in some cases. More precisely, the unit performs the control in accordance with the information representing how many RAMs should not be used.

Embodiment 3 is designed to work well for a low-grade second cache that has a small storage capacity or for a second cache in which any WAY that frequently malfunctions is stopped when the number of errors it has made reaches a predetermined value. The information representing such a static or dynamic degradation can suppress the application of the clock signal at appropriate timing. Hence, the supply of the clock signal to any WAY that is not used can be stopped. This decreases the unnecessary power consumption.

Figure 5:
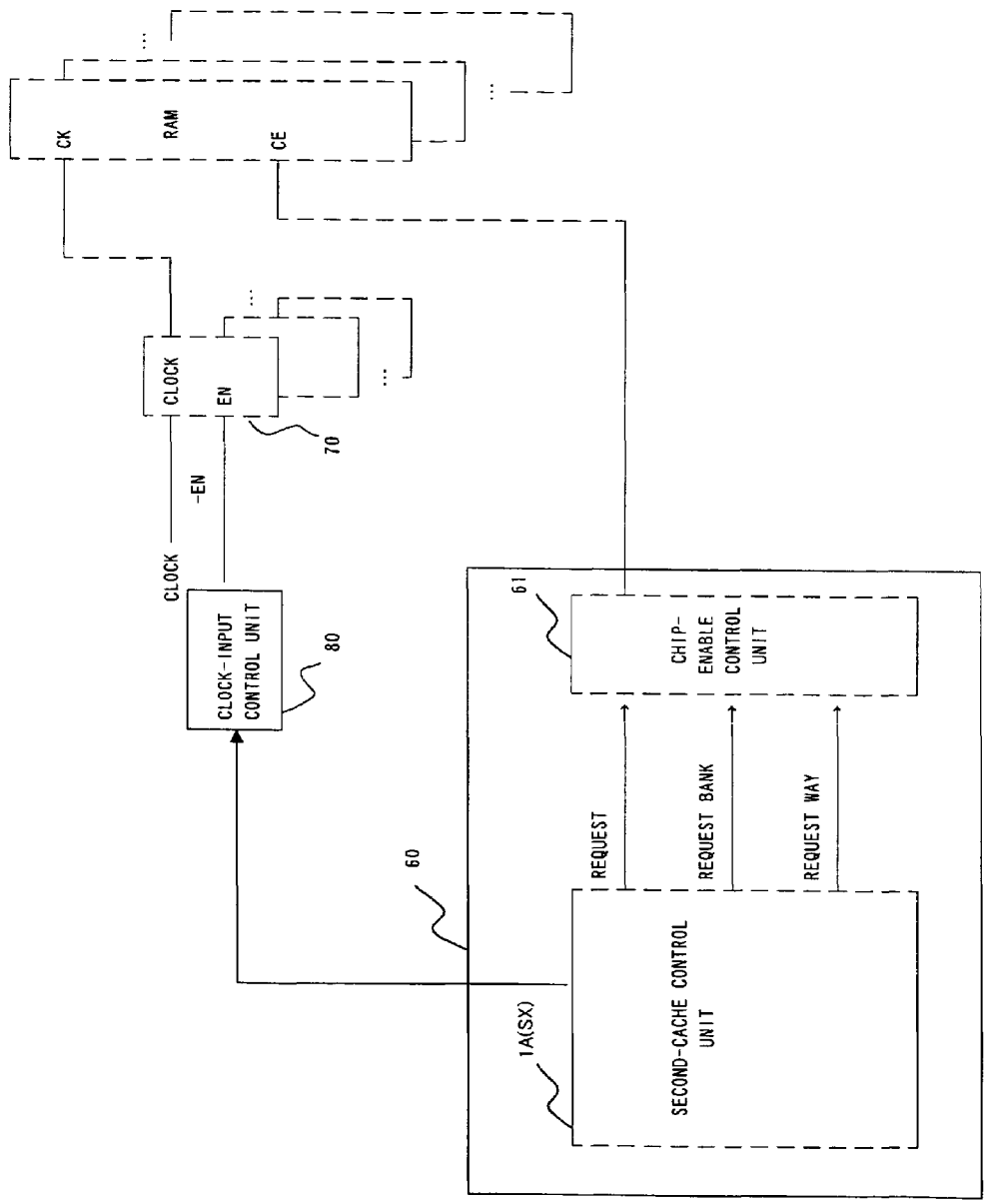
FIG. 5 is a block diagram of Embodiment 3 of the invention.

FIG. 5 is a block diagram of Embodiment 3. The clock macro for driving the RAMs has a clock-enable terminal 70. To the clock-enable terminal 70, there is input a non-enable signal (-EN) that limits the number of RAMs to be used. The non-enable signal (-EN) has been generated by a clock-input control unit 80. The clock-input control unit 80 receives the way values of the RAMs that should not be used. These way values are supplied from, for example, a second-cache control unit 1A.

Any RAM that should be stopped is stopped upon receiving the non-enable signal (-EN), no matter whether the second-cache control circuit 60 has supplied a stop-instructing signal to the RAM.

What is claimed is:

1. A circuit for driving and controlling a second cache incorporated in a processor and comprising a plurality of RAMs, the circuit comprising:
    a decision unit that receives an access request for an access to the second cache and designates some of the RAMs, which need not operate, in accordance with the type or address of the access request, or both; and
    a stop-instruction output unit that outputs an intra-macro stop-instructing signal to the RAMs that have been designated by the decision unit wherein each of the RAMs comprises a memory-cell array, a first group of latches that input various external data items to the RAM, and a second group of latches that access the memory-cell array at prescribed timing in accordance with the data items input from the latches of the first group; and the stop-instruction output unit electrically disconnects the first group of latches and the second group of latches, or electrically disconnects the memory-cell array and the first and second group of latches.

2. The circuit for driving and controlling a second cache, according to claim 1, wherein upon receiving the access request, the decision unit designates RAMs that need not operate, in accordance with a combination of WAY and BANK.

3. The circuit for driving and controlling a second cache, according to claim 1, wherein the access request includes a read request, a write request and a modify request.

4. A second cache designed for use in a processor and comprising a plurality of RAMs, the second cache comprising:
   a decision unit that receives an access request for an access to the second cache and designates some of the RAMs, which need not operate, in accordance with the type or address of the access request, or both;
   a stop-instruction output unit that outputs an intra-macro stop-instructing signal to the RAMs that have been designated by the decision unit; and
   an operation-stopping unit that is provided in each of the RAMs and stops the operation of the RAM in response to the intra-macro stop-instructing signal from the stop-instruction output unit wherein each of the RAMs comprises a memory-cell array, a first group of latches that input various external data items to the RAM, and a second group of latches that access the memory-cell array at prescribed timing in accordance with the data items input from the latches of the first group; and the stop-instruction output unit electrically disconnects the first group of latches and the second group of latches, or electrically disconnects the memory-cell array and the first and second group of latches.

5. The second cache according to claim 4, further comprising a clock-input control unit that controls the inputting of a clock signal to some of the RAMs, which need not be used in some cases, in accordance with information representing how many RAMs should not be used.

6. The second cache according to claim 4, wherein each of the RAMs is a pipelined RAM.

7. A RAM comprising:
   a memory-cell array which stores data;
   a first group of latches that receive various external data items;
   a second group of latches that access the memory-cell array at prescribed timing in accordance with the data obtained at the latches of the first group; and
   an operation-stopping unit that receives an intra-macro stop-instructing signal from an external device and stops at least the memory cell array wherein the operation-stopping unit electrically disconnects at least either the first group of latches and the second group of latches, or the memory-cell array and the second groups of latches, in accordance with the intra-macro stop instructing signal supplied form the external device.

8. The RAM according to claim 7, further comprising a chip-enable terminal that receives instruction signals supplied from an external devices.

9. The RAM according to claim 7, which is a pipelined RAM.

10. A method of driving and controlling a second cache incorporated in a processor and comprising a plurality of RAM, the method comprising:
   a step of receiving an access request for an access to the second cache and designating some of the RAMs, which need not operate, in accordance with the type or address of the access request, or both; and
   a step of outputting an intra-macro stop-instructing signal to the RAMs that have been designated in the step of receiving the access request and designating some of the RAMs wherein each of the RAMs comprises a memory-cell array, a first group of latches that input various external data items to the RAM, and a second group of latches that access the memory-cell array at prescribed timing in accordance with the data items input from the latches of the first group; and
   the first group of latches and the second group of latches, or the memory-cell array and the first and second groups of latches, are electrically disconnected in response to the intra-macro stop-instructing signal.

\* \* \* \* \*

UNITED STATES PATENT AND TRADEMARK OFFICE
CERTIFICATE OF CORRECTION

PATENT NO. : 7,366,820 B2
APPLICATION NO. : 10/999065
DATED : April 29, 2008
INVENTOR(S) : Mie Tonosaki et al.

It is certified that error appears in the above-identified patent and that said Letters Patent is hereby corrected as shown below:

Column 6, Line 61, after "unit" insert --;--.

Column 7, Line 26, after "unit" insert --;--.

Column 8, Line 10, after "array" insert --;--.

Column 8, Line 31, after "RAMs" insert --;--.

Signed and Sealed this

Sixteenth Day of September, 2008

JON W. DUDAS
*Director of the United States Patent and Trademark Office*